United States Patent
Lee

(10) Patent No.: US 8,422,331 B2
(45) Date of Patent: Apr. 16, 2013

(54) DATA OUTPUT CONTROL CIRCUIT AND DATA OUTPUT CONTROL METHOD

(75) Inventor: Hyeng Ouk Lee, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 263 days.

(21) Appl. No.: 13/017,486

(22) Filed: Jan. 31, 2011

(65) Prior Publication Data

US 2011/0175654 A1  Jul. 21, 2011

Related U.S. Application Data

(63) Continuation-in-part of application No. 11/683,490, filed on Mar. 8, 2007, now abandoned.

(30) Foreign Application Priority Data

Sep. 29, 2006  (KR) .................. 10-2006-0096616

(51) Int. Cl.
*G11C 8/18* (2006.01)
(52) U.S. Cl.
USPC ............. 365/233.17; 365/233.1; 365/233.11; 365/233.12; 365/191; 365/193; 365/194
(58) Field of Classification Search ............... 365/233.1, 365/233.11, 233.12, 233.17, 193, 194, 191
See application file for complete search history.

(56) References Cited

U.S. PATENT DOCUMENTS

| | | | |
|---|---|---|---|
| 6,208,583 B1 | 3/2001 | Fujiwara | |
| 6,707,759 B2 | 3/2004 | Song | |
| 6,738,295 B2 | 5/2004 | Kim | |
| 6,842,396 B2 | 1/2005 | Kono | |
| 6,894,945 B2 | 5/2005 | Sawada | |
| 6,944,091 B2 | 9/2005 | Lee et al. | |
| 7,298,667 B2 | 11/2007 | Oh et al. | |
| 2004/0008566 A1 | 1/2004 | Song | |
| 2004/0052152 A1 | 3/2004 | Kono | |
| 2004/0081013 A1 | 4/2004 | Lee et al. | |
| 2005/0187724 A1 | 8/2005 | Kim et al. | |
| 2005/0243607 A1* | 11/2005 | Lee | 365/189.01 |
| 2005/0254337 A1 | 11/2005 | Lee et al. | |

OTHER PUBLICATIONS

USPTO OA mailed Sep. 30, 2010 in connection with U.S. Appl. 11/683,490.

* cited by examiner

*Primary Examiner* — Hoai V Ho
*Assistant Examiner* — Jay Radke
(74) *Attorney, Agent, or Firm* — Ladas & Parry LLP

(57) ABSTRACT

A data output control circuit controls a data output in a read operation. A data output control method includes a count shifting mode and a delay mode and can be used in low and high frequency operations, so that a data output can be stably controlled in a broad frequency range. The data output control circuit includes: a low frequency mode controller a high frequency mode controller and a selector selecting any one of first and second command signals through CAS latency information to be output as a data output control signal.

45 Claims, 13 Drawing Sheets

DATA OUTPUT CONTROL CIRCUIT AND DATA OUTPUT CONTROL METHOD

CROSS-REFERENCE TO RELATED APPLICATIONS

The present application claims priority to Korean patent application number 10-2006-0096616 filed on Sep. 29, 2006, which is incorporated herein by reference in its entirety.

BACKGROUND OF THE INVENTION

The present invention relates to a semiconductor memory device, and more precisely to a data output control circuit for controlling a data output in a read operation and a data output control method.

In general, a semiconductor memory device controls the output timing of data read through a data output control circuit so as to transmit data from a memory cell after a read instruction to the outside in a corresponding clock cycle for each CAS latency CL.

Such a conventional data output control circuit may be configured as shown in FIG. 1. Its operation is described below with reference to FIG. 2, which illustrates waveforms of the data output control circuit of FIG. 1 in a case where a CAS latency is 5 (CL=5).

First, a read command signal READ generated in a read operation is output as an internal read command signal RDCMD from the read command generator 1 after 'tCMD' seconds and after an external clock CLK is output as a DLL clock DLLCLK having a negative delay through a delay locked loop 2.

The term 'tCMD' denotes a time that is delayed until an internal read command signal RDCMD is generated from a rising edge of an external clock CLK to which a read command signal READ is applied. Further, the DLL clock signal DLLCLK is a signal used to synchronize data DATA, to an external clock signal CLK when the data DATA is output as DQ by compensating for an output delay time within a memory.

Thereafter, the internal read command signal RDCMD is shifted four times through a count shifter 3 in accordance with the CAS latency CL to be output as a data output control signal OUTEN. Further, the data DATA is delayed by 'tDO+ a' in the data output control signal OUTEN and synchronized to a rising edge of the external clock signal CLK to be output as the DQ.

The count shifter 3 shifts or delays the internal read command signal RDCMD by 'tOED,' in which 'tCMD,' 'tDO' and 'a' are subtracted from a CAS latency count delay time, the 'tCMD' being a time delayed until an internal read command signal RDCMD is generated from a CAS latency count delay time after a read instruction, the 'tDO' denoting a time difference between an external clock signal CLK and a DLL clock signal DLLCLK, and the 'a' being a time for securing a data margin. At this time, each of the generated clock signals OUT_PRE1 to OUT_PRE3 has a certain shifting margin due to the DLL clock DLLCLK.

Since the cycle of an external clock signal CLK is reduced as frequencies become high, the time at which read data DATA is output as DQ becomes shortened by the reduced cycle. On the contrary, since 'tCMD' and 'tDO' are not changed, 'tOED' is reduced.

If 'tOED' is reduced, the shifting margin of each clock signal OUT_PRE1 to OUT_PRE3 becomes small. Further, if such a shifting margin reaches a limit, the phase and pulse width of each clock signal OUT_PRE1 to OUT_PRE3 or an output enable signal OUTEN may be distorted during a shifting operation.

As an example, in a case where the count shifter 3 includes a plurality of flip flops (not shown), each of the flip flops shifts a clock signal input from an rising edge of a DLL clock signal DLLCLK. At this time, if the pulse width of the DLL clock signal DLLCLK is reduced due to a high-frequency operation, there may occur a case where each of the flip flops does not shift a clock signal at an exact time point.

If the phase and pulse width of each clock signal OUT_PRE1 to OUT_PRE3 or an output enable signal OUTEN is distorted due to such a case, read data is not output at an exact time point. As a result, there is a problem in that a failure may occur.

SUMMARY OF THE INVENTION

There is provided a data output control circuit of a semiconductor memory device for controlling a data output in a read operation. The circuit includes: a low frequency mode controller controlling a read command signal in a first operation mode to be output as a first command signal if it is determined to be a low frequency operation through a first CAS latency control signal; a high frequency mode controller controlling a read command signal in a second operation mode to be output as a second command signal if it is determined to be a high frequency operation through a second CAS latency control signal; and a selector selecting any one of the first and second command signals through CAS latency information to be output as a data output control signal.

Preferably, the first CAS latency control signal is a control signal for low frequencies, in which a CAS latency is bypassed, and the second CAS latency control signal is a control signal for high frequencies, generated by the CAS latency and data output delay information.

Preferably, the low frequency mode controller counts and shifts the read command signal in accordance with the CAS latency to be output as the first command signal.

Preferably, the high frequency mode controller delays the read command signal by a time in which a time corresponding to the data output delay is subtracted from the CAS latency so as to be output as the second command signal.

Preferably, the high frequency mode controller delays the read command signal by a time in which an internal read command signal generation delay time is added to a time difference between external and DLL clock signals so as to be output as the second command signal after a read instruction.

Preferably, the selector outputs the first command signal as the data output control signal in a low frequency operation, and outputs the second command signal as the data output control signal in a high frequency operation.

According to a second aspect of the present invention, there is provided a data output control circuit of a semiconductor memory device for controlling a data output time point using a CAS latency and a DLL clock in a read operation, which includes: an operation mode controller providing a mode selection signal with which at least high and low frequencies can be discriminated in accordance with the frequency of the external clock signal through the CAS latency information and the external clock signal, and a pulse signal with a pulse width corresponding to a data output time point in high frequencies; a count shifter counting and shifting an internal read command signal generated to perform the read operation by synchronizing it to the DLL clock in accordance with the state of the mode selection signal so as to be output as a first command signal; a delay unit delaying the internal read command signal by the pulse width of the pulse signal in accordance with the state of the mode selection signal so as to be output as a second command signal; and a selector selecting any one of the first and second command signals in accordance with the state of the mode selection signal so as to be output as a data output control signal.

Preferably, the operation mode controller compares first, second and third times so as to determine an operation mode depending on a frequency, the first time being a CAS latency count delay time, the second time being an internal read command signal generation delay time after a read instruction and the third time being a time difference between the external clock signal and the DLL clock signal.

Preferably, the operation mode controller includes: a pulse generator generating a reference pulse signal with a pulse width that becomes a reference in discriminating high frequencies from low frequencies; a first delay unit delaying the reference pulse signal by the first time through the CAS latency information and the external clock signal to be output as a first delay pulse signal; a second delay unit delaying the reference pulse signal by a time in which the second and third times are added together to be output as a second delay pulse signal; and a controller outputting the mode selection signal for comparing the first and second delay pulse signals to select an operation mode depending on a frequency and the pulse signal having a pulse width of a fourth time in which the addition of the second and third times is subtracted from the first time.

Preferably, the controller outputs the mode selection signal denoting that the external clock signal is a high frequency if the first delay pulse signal is enabled when the second delay pulse is in an enable state, and outputs the mode selection signal denoting that the external clock signal is a low frequency if the first delay pulse signal is disabled when the second delay pulse is in an enable state.

Preferably, the controller outputs a pulse signal having a pulse width of the fourth time that is enabled when the second delay pulse signal is enabled, and disabled when the first delay pulse is enabled.

Preferably, the delay unit is operated when the operation is determined to be a high frequency operation by the state of the mode selection signal.

Preferably, the delay unit includes: a phase detector counting the pulse signal to detect the pulse width of the pulse signal when the operation is determined to be a high frequency operation by the state of the mode selection signal; and a command delay unit delaying the internal read command signal in accordance with an output signal of the phase detector to be output as the second command signal.

Preferably, the phase detector includes: a plurality of first unit delay means connected in series to delay the pulse signal as a unit of a predetermined delay; a detection means comparing the pulse signal to an output of each of the first unit delay means to be output as a detection signal enabled at a time point in which the pulse signal is disabled; and a selection means operated by the mode selection signal to output a delay selection signal for determining a delay degree of the internal read command signal through the detection signal.

Preferably, the command delay unit includes: a second unit delay means connected in series to delay the internal read command signal as a predetermined unit; and a plurality of switching means each connected between an input/output node of each of the second unit delay means and a common node to be controlled by an output signal of the phase detector, wherein the switching means corresponding to the output of the phase detector is turned on such that the second command signal is output to the common node.

Preferably, the count shifter counts and shifts the internal read command signal through the CAS latency information and the DLL clock signal to be output as the first command signal when the operation is determined to be a low frequency operation by the state of the mode selection signal.

Preferably, the count shifter is operated by the mode selection signal to count the internal read command signal by the CAS latency from which 1 is subtracted through the DLL clock signal.

According to a third aspect of the present invention, there is a provided a data output control circuit, which includes: a read command generator generating a first internal read command signal through a read command signal generated in a read operation; a delay locked loop negative-delaying an external clock signal to be output as a DLL clock signal for the purpose of synchronizing read data to the external clock signal; an operation mode controller providing a mode selection signal with which at least high and low frequencies can be discriminated in accordance with the frequency of the external clock signal through a CAS latency information and an external clock signal, and a pulse signal with a pulse width corresponding to a data output time point in high frequencies; a count shifter counting and shifting the first internal read command signal by synchronizing it to the DLL clock in accordance with the state of the mode selection signal so as to be output as a second command signal; a delay unit delaying the first internal read command signal by the pulse width of the pulse signal in accordance with the state of the mode selection signal so as to be output as a third command signal; and a selector selecting any one of the second and third command signals in accordance with the state of the mode selection signal so as to be output as a data output control signal.

Preferably, the operation mode controller compares first, second and third times so as to determine an operation mode depending on a frequency, the first time being a CAS latency count delay time, the second time being a first internal read command signal generation delay time after a read instruction and the third time being a time difference between the external clock signal and the DLL clock signal.

Preferably, the operation mode controller includes: a pulse generator generating a reference pulse signal with a pulse width that becomes a reference in discriminating high frequencies from low frequencies; a first delay unit delaying the reference pulse signal by the first time through the CAS latency information and the external clock signal to be output as a first delay pulse signal; a second delay unit delaying the reference pulse signal by a time in which the second and third times are added together to be output as a second delay pulse signal; and a controller outputting the mode selection signal for comparing the first and second delay pulse signals to select an operation mode depending on a frequency and the pulse signal having a pulse width of a fourth time in which the addition of the second and third times is subtracted from the first time.

Preferably, the controller outputs the mode selection signal denoting that the external clock signal is a high frequency if the first delay pulse signal is enabled when the second delay pulse is in an enable state, and outputs the mode selection signal denoting that the external clock signal is a low frequency if the first delay pulse signal is disabled when the second delay pulse is in an enable state.

Preferably, the controller outputs a pulse signal having a pulse width of the fourth time that is enabled when the second delay pulse signal is enabled, and disabled when the first delay pulse is enabled.

Preferably, the delay unit is operated when the operation is determined to be a high frequency operation by the state of the mode selection signal.

Preferably, the delay unit includes: a phase detector counting the pulse signal to detect the pulse width of the pulse signal when the operation is determined to be a high frequency operation by the state of the mode selection signal; and a command delay unit delaying the first internal read command signal in accordance with an output signal of the phase detector to be output as the third internal read command signal.

Preferably, the phase detector includes: a plurality of first unit delay means connected in series to delay the pulse signal as a unit of a predetermined delay; a detection means comparing the pulse signal to an output of each of the first unit delay means to be output as a detection signal enabled at a time point in which the pulse signal is disabled; and a selection means operated by the mode selection signal to output a delay selection signal for determining a delay degree of the first internal read command signal through the detection signal.

Preferably, the command delay unit includes: a second unit delay means connected in series to delay the first internal read command signal as a predetermined unit; and a plurality of switching means each connected between an input/output node of each of the second unit delay means and a common node to be controlled by an output signal of the phase detector, wherein the switching means corresponding to the output of the phase detector is turned on such that the third internal read command signal is output to the common node.

Preferably, the count shifter counts and shifts the internal read command signal through the CAS latency information and the DLL clock signal to be output as the second internal read command signal when the operation is determined to be a low frequency operation by the state of the mode selection signal.

Preferably, the count shifter is operated by the mode selection signal to count the internal read command signal by the CAS latency from which 1 is subtracted through the DLL clock signal.

According to a fourth aspect of the present invention, there is provided a data output control circuit, which includes: a read command generator generating a first internal read command signal through a read command signal generated in a read operation; a delay locked loop negative-delaying an external clock signal to be output as a DLL clock signal for the purpose of synchronizing read data to the external clock signal; an operation mode controller providing a mode selection signal with which at least high and low frequencies can be discriminated in accordance with the frequency of the external clock signal through a CAS latency information and an external clock signal, and a pulse signal with a pulse width corresponding to a data output time point in high frequencies; a delay unit counting the pulse signal to detect the pulse width of the pulse signal in accordance with the state of the mode selection signal, and then delaying the first internal read command signal by the pulse width of the pulse signal to be output as a second internal read command signal; a command selector selecting any one of the first and second internal read command signals in accordance with the state of the mode selection signal so as to be output as a third internal read command signal; and a data output controller counting and shifting the third internal read command signal by synchronizing it to the DLL clock in accordance with the state of the mode selection signal, or outputting an output signal of the delay detection mode unit delay locked loop) as it is to be output as a data output control signal.

Preferably, the operation mode controller compares first, second and third times so as to determine an operation mode depending on a frequency, the first time being a CAS latency count delay time, the second time being an internal read command signal generation delay time after a read instruction and the third time being a time difference between the external clock signal and the DLL clock signal.

Preferably, the operation mode controller includes: a pulse generator generating a reference pulse signal with a pulse width that becomes a reference in discriminating high frequencies from low frequencies; a first delay unit delaying the reference pulse signal by the first time to be output as a first delay pulse signal; a second delay unit delaying the reference pulse signal by a time in which the second and third times are added together to be output as a second delay pulse signal; and a controller outputting the mode selection signal for comparing the first and second delay pulse signals to select an operation mode depending on a frequency and the pulse signal having a pulse width of a fourth time in which the addition of the second and third times is subtracted from the first time.

Preferably, the controller outputs the mode selection signal denoting that the external clock signal is a high frequency if the first delay pulse signal is enabled when the second delay pulse is in an enable state, and outputs the mode selection signal denoting that the external clock signal is a low frequency if the first delay pulse signal is disabled when the second delay pulse is in an enable state.

Preferably, the controller outputs a pulse signal having a pulse width of the fourth time that is enabled when the second delay pulse signal is enabled, and disabled when the first delay pulse is enabled.

Preferably, the delay unit is operated when the operation is determined to be a high frequency operation by the state of the mode selection signal.

Preferably, the delay unit includes: a phase detector counting the pulse signal to detect the pulse width of the pulse signal when the operation is determined to be a high frequency operation by the state of the mode selection signal; and a command delay unit delaying the first internal read command signal in accordance with an output signal of the phase detector to be output as the second internal read command signal.

Preferably, the phase detector includes: a plurality of first unit delay means connected in series to delay the pulse signal as a unit of a predetermined delay; a detection means comparing the pulse signal to an output of each of the first unit delay means to be output as a detection signal enabled at a time point in which the pulse signal is disabled; and a selection means operated by the mode selection signal to output a delay selection signal for determining a delay degree of the first internal read command signal through the detection signal.

Preferably, the command delay unit includes: a second unit delay means connected in series to delay the first internal read command signal as a predetermined unit; and a plurality of switching means each connected between an input/output node of each of the second unit delay means and a common node to be controlled by an output signal of the phase detector, wherein the switching means corresponding to the output of the phase detector is turned on such that the second internal read command signal is output to the common node.

Preferably, the command selector includes: an inverter inverting the mode selection signal; a first NAND gate NAND combining the first internal read command signal and an output signal of the inverter; a second NAND gate NAND combining the second internal read command signal and the mode selection signal; and a third NAND gate NAND combining outputs of the first and second NAND gates to be output as the third internal read command signal.

Preferably, the data output controller includes: a count shifter counting and shifting the third internal read command signal through the CAS latency information and the DLL clock signal to be output as the data output control signal when the operation is determined to be a low frequency operation by the state of the mode selection signal; and a transmission unit outputting the third internal read command signal as the data output control signal as it is when the operation is determined to be a high frequency operation by the state of the mode selection signal.

Preferably, the count shifter is operated by the mode selection signal to count the internal read command signal by the CAS latency from which 1 is subtracted through the DLL clock signal.

To achieve these objects of the present invention, according to a first aspect of the present invention, there is provided a data output time point control method (→data output control method), which includes: a first step of comparing first, second and third times to select a delay mode if it is determined to be a high frequency operation and to select a count shifting mode if it is determined to be a low frequency operation, the first time being a CAS latency count delay time, the second time being an internal read command signal generation delay time after a read instruction and the third time being a time difference between an external clock signal and a DLL clock signal; a second step of detecting a fourth time in which the addition of the second and third times is subtracted from the first time and then delaying the internal read command signal by the fourth time to be output as a data output control signal for controlling a data output time point in a delay mode; and a third step of counting the internal read command signal through the DLL clock signal to be output as the data output control signal shifted by the fourth time in a count shifting mode.

Preferably, the first step includes the sub-steps of: generating a reference pulse signal with a pulse width that becomes a reference in discriminating high frequencies from low frequencies; delaying the reference pulse signal by the first time to be output as a first delay pulse signal; delaying the reference pulse signal by a time in which the second and third times are added together to be output as a second delay pulse signal; and comparing the first and second delay pulse signals to select the delay mode if the first delay pulse signal is enabled when the second delay pulse signal is in an enable state and to select the count shifting mode if the first delay pulse signal is disabled when the second delay pulse signal is in an enable state.

Preferably, the second step includes the sub-steps of: counting a signal having a pulse width of the fourth time to the fourth time; and delaying the internal read command signal by the fourth time to be output as the data output control signal.

According to a fifth aspect of the present invention, there is provided a data output control method, which includes: a first step of generating a first internal read command signal through a read command signal generated in a read operation; a second step of negative-delaying an external clock signal to be output as a DLL clock signal for the purpose of synchronizing read data to the external clock signal; a third step of comparing first, second and third times to select a delay mode if it is determined to be a high frequency operation and to select a count shifting mode if it is determined to be a low frequency operation, the first time being a CAS latency count delay time, the second time being an internal read command signal generation delay time after a read instruction and the third time being a time difference between the external clock signal and the DLL clock signal; a fourth step of outputting a pulse signal having a pulse width of a fourth time in which the addition of the second and third times is subtracted from the first time in the delay mode; a fifth step of counting the first delay pulse signal to detect the fourth time in the delay mode and then delaying the first internal read command signal by the fourth time to be output as a second internal read command signal; a sixth step of selecting the first internal read command signal in the count shifting mode, and selecting the second internal read command signal in the delay mode; and a seventh step of counting the first internal read command signal through the DLL clock signal to be output as a data output control signal for controlling a data output time point shifted by the fourth time in a count shifting mode, and outputting the second internal read command signal as the data output control signal as it is in the delay mode.

Preferably, the first step comprises the sub-steps of: generating a reference pulse signal with a pulse width that becomes a reference in discriminating high frequencies from low frequencies; delaying the reference pulse signal by the first time to be output as a first delay pulse signal; delaying the reference pulse signal by a time in which the second and third times are added together to be output as a second delay pulse signal; and comparing the first and second delay pulse signals to select the delay mode if the first delay pulse signal is enabled when the second delay pulse signal is in an enable state and to select the count shifting mode if the first delay pulse signal is disabled when the second delay pulse signal is in an enable state.

Preferably, the second step includes the sub-steps of: counting a signal having a pulse width of the fourth time to the fourth time; and delaying the internal read command signal by the fourth time to be output as the data output control signal.

DESCRIPTION OF SPECIFIC EMBODIMENTS

Hereinafter, preferred embodiments of the present invention will be described in detail with reference to the accompanying drawings.

Figure 1:
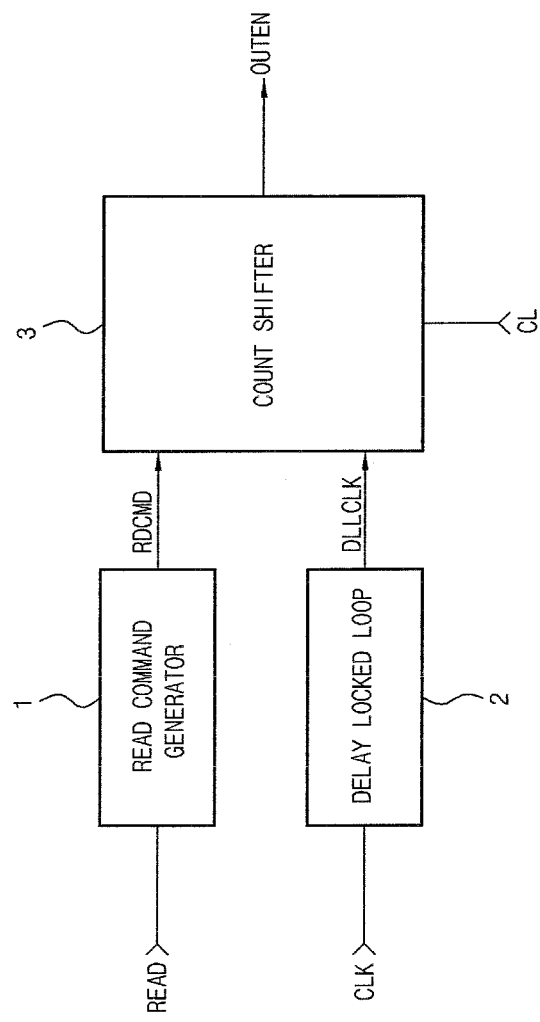
FIG. 1 is a block diagram showing a data output control circuit according to a related art.
Figure 2:
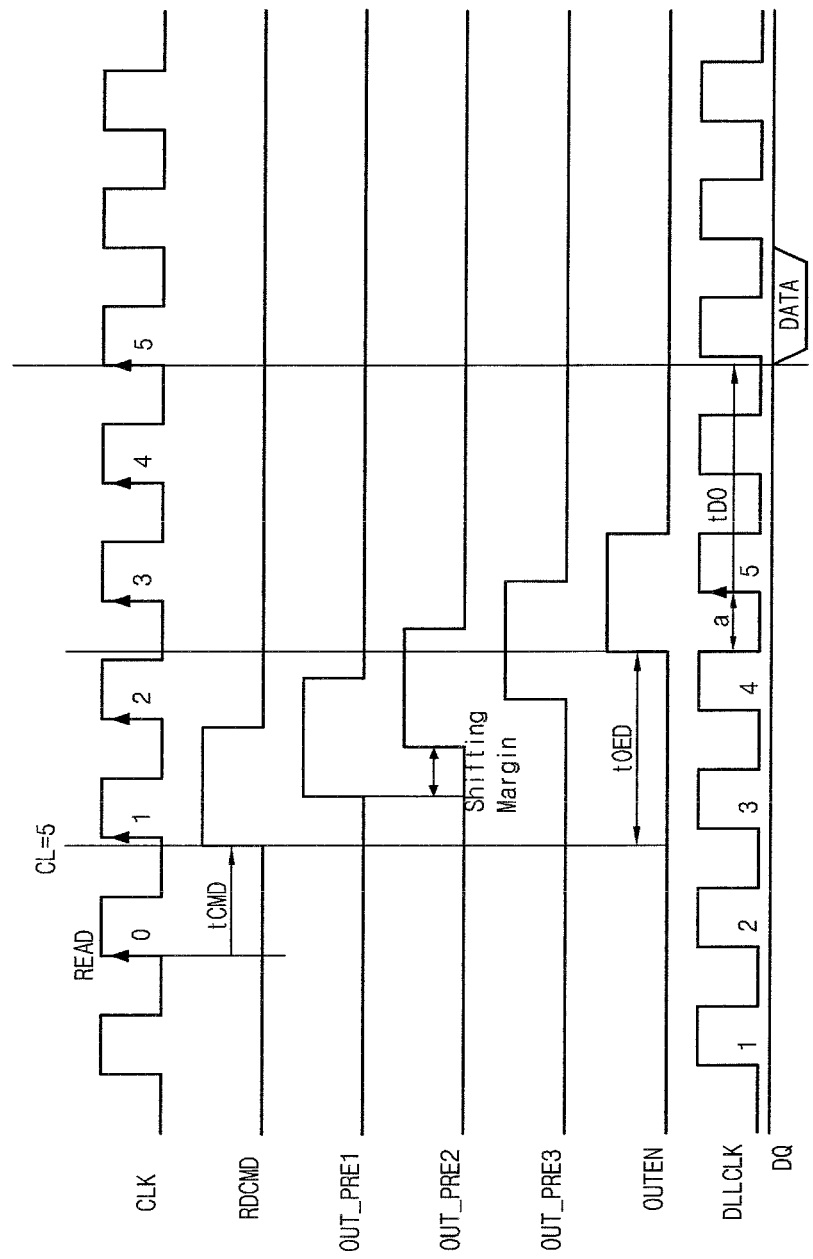
FIG. 2 is a waveform diagram illustrating an operation of FIG. 1.
Figure 3:
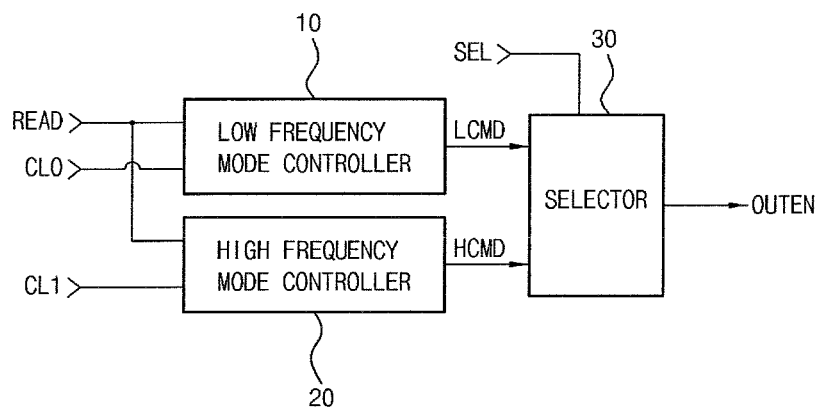
FIG. 3 is a block diagram showing a data output control circuit according to an embodiment of the present invention.

FIG. 3 shows a first embodiment of the present invention, which is defined by the appurtenant claims and not by any one or more embodiments described herein. In this embodiment, a data output control varies depending on an operation frequency, so that a data output can be stably controlled over a broad range of frequencies.

Specifically, this embodiment of FIG. 3 includes a low frequency mode controller 10, a high frequency mode controller 20 and a selector 30. If a low frequency operation is selected by the CAS latency control signal CL0, the low frequency mode controller 10 controls a read command signal READ to be output as a command signal LCMD for low frequencies in accordance with a low frequency mode operation.

The CAS latency control signal CL0, is a control signal for low frequencies in which CAS latency CL is bypassed.

If a high frequency operation is determined through a CAS latency control signal CL1, the high frequency mode controller 20 controls the read command signal READ to be output as a command signal HCMD for high frequencies in accordance with a high frequency mode operation. The CAS latency control signal CL1 is therefore also a control signal for high frequencies, generated by a CAS latency CL and data output delay information, i.e., 'tCMD' and 'tDO'.

The selector 30 selects one of the command signal LCMD for low frequencies and the command signal HCMD for high frequencies to be output as a data output control signal OUTEN in accordance with a selection signal SEL.

The selection signal SEL is a logical signal corresponding to a high/low frequency depending on a CAS latency CL. That is, this embodiment of FIG. 3 determines a data output control method in accordance with an operation frequency.

Figure 4:
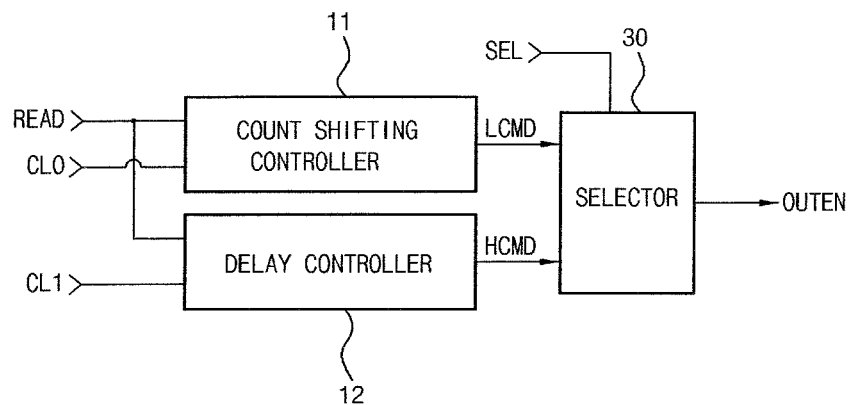
FIG. 4 is a block diagram showing an example of a configuration of low and high frequency mode controllers 10 and 20 in FIG. 3.

As shown in FIG. 4, count shifting and delay operations are used as such a data output control method in accordance with a frequency.

Specifically, as shown in FIG. 4, the low and high frequency mode controllers 10 and 20 may be embodied as a count shifting controller 11 and a delay controller 21, respectively.

If a low frequency operation is determined through a CAS latency signal CL (→CL0), the count shifting controller 11 counts and shifts a read command signal READ as before to be output as a command signal LCMD for low frequencies. If a high frequency operation is determined through a CAS latency signal CL (→CL1), the delay unit 21 delays a read command signal READ to be output as a command signal HCMD for high frequencies using a delay line or the like.

As such, the embodiment of FIG. 4 shifts a read command signal READ to be output as a data output control signal OUTEN using a count shifting mode in a low frequency operation, and delays a read command signal READ to be output as a data output control signal OUTEN using a delay mode in a high frequency operation. Such an embodiment of the present invention may be specifically implemented as shown in FIG. 5.

Figure 5:
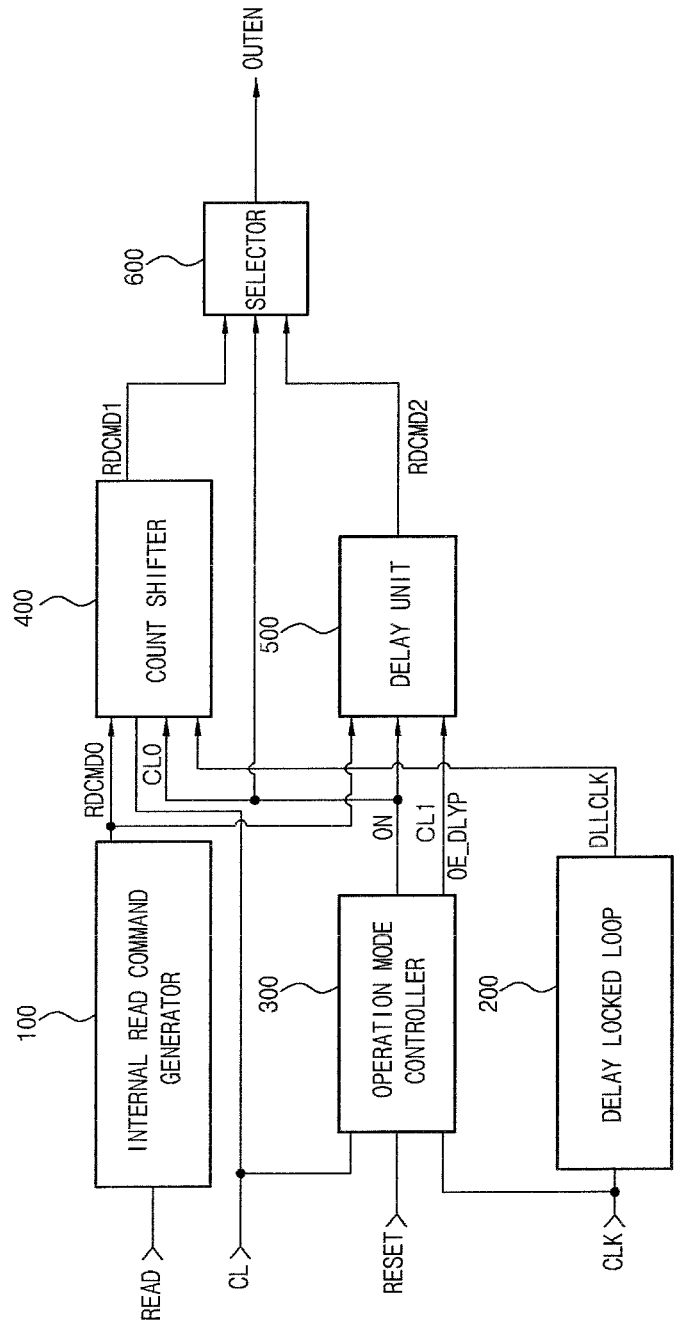
FIG. 5 is a block diagram showing an example of a data output control circuit in FIG. 4.

FIG. 5 shows an internal read command generator 100, a delay locked loop 200, an operation mode controller 300, a count shifter 400, a delay unit 500 and a selector 600.

If a read command signal READ is input, the internal read command generator 100 generates an internal read command signal RDCMD0 after 'tCMD'. In order to synchronize read data to an external clock signal CLK, the delay locked loop 200 negative-delays the external clock signal CLK to be output as a DLL clock signal DLLCLK.

The operation mode controller 300 outputs a mode selection signal ON for selecting either a count shifting mode or a delay mode in accordance with an operation frequency and a delay pulse signal OE_DLYP having a pulse width of 'tOED'. At that time, the mode selection signal ON which provided to the counter shifter 400 can be corresponding to the CAS latency signal CL0, and the mode selection signal ON provided to the delay unit 500 can be corresponding to the CAS latency signal CL1.

Figure 6:
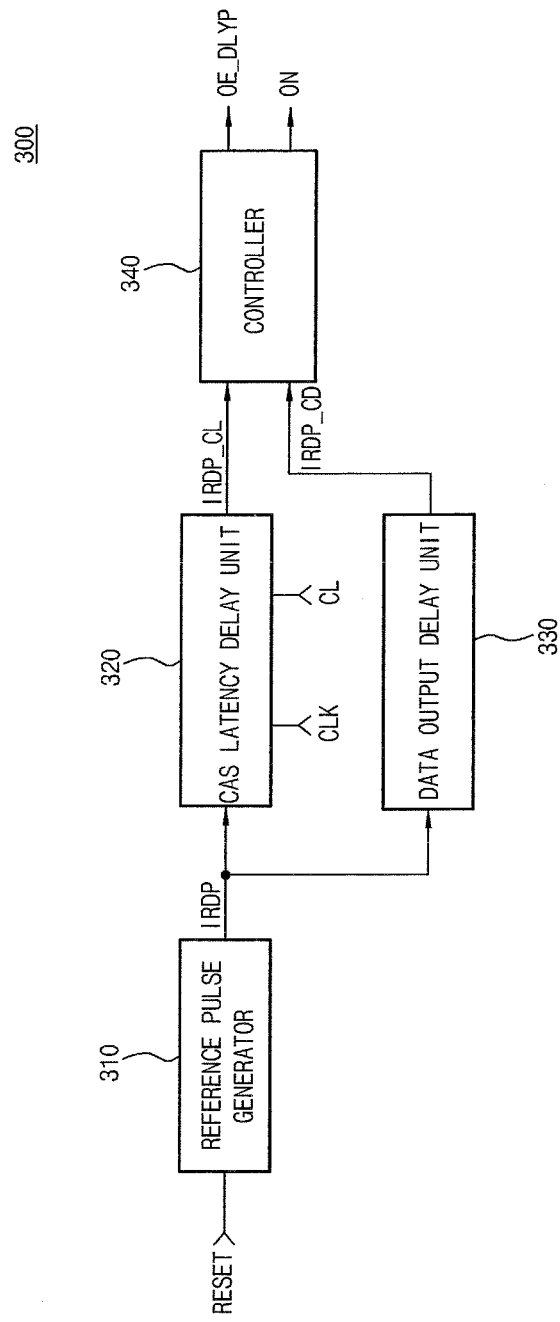
FIG. 6 is a block diagram showing an example of a operation mode controller 300 in FIG. 5.

As shown in FIG. 6, the operation mode controller 300 includes a reference pulse generator 310, a CAS latency delay unit 320, a data output delay unit 330 and a controller 340.

Here, the reference pulse generator 310 is operated by a reset signal RESET to generate a reference pulse signal IRDP with a pulse width that becomes a reference in discriminating high frequencies from low frequencies. The reference pulse generator 310 may be easily implemented with a ring oscillator or the like.

Further, the CAS latency delay unit 320 delays the reference pulse signal IRDP by a CAS latency count delay time through an external clock signal CLK and a CAS latency signal CL to be output as a delay pulse signal IRDP_CL. The data output delay unit 330 delays the reference pulse signal IRDP by a time in which 'tCMD' and 'tDO' are added together to be output as a delay pulse signal IRDP_CD.

Further, the controller 340 compares the delay pulse signal IRDP_CL to the delay pulse signal IRDP_CD. If the delay pulse signal IRDP_CL is enabled when the delay pulse signal IRDP_CD is in an enable state, the controller 340 outputs a mode selection signal ON for selecting a delay mode. If the delay pulse signal IRDP_CL is disabled when the delay pulse signal IRDP_CD is in an enable state, the controller 340 outputs a mode selection signal ON for selecting a count shifting mode.

Furthermore, the controller 340 outputs a delay pulse signal OE_DLYP having a pulse width of 'tOED' in which the delay pulse signal OE_DLYP is enabled at a rising edge of the delay pulse signal IRDP_CD and disabled at a rising edge of the delay pulse signal IRDP_CL.

The count shifter 400 shown in FIG. 5, is operated by the mode selection signal ON, and shifts the internal RDCMD0 by synchronizing it to the DLL clock signal DLLCLK so as to be output as an internal read command signal RDCMD1.

The delay unit 500 shown in FIG. 5 is turned on in a high frequency operation. The delay unit 500 counts the delay pulse signal OE_DLYP to detect a time point at which the delay pulse signal OE_DLYP is disabled, and then delays the internal read command signal RDCMD up to a time point at which the delay pulse signal OE_DLYP is disabled.

Figure 7:
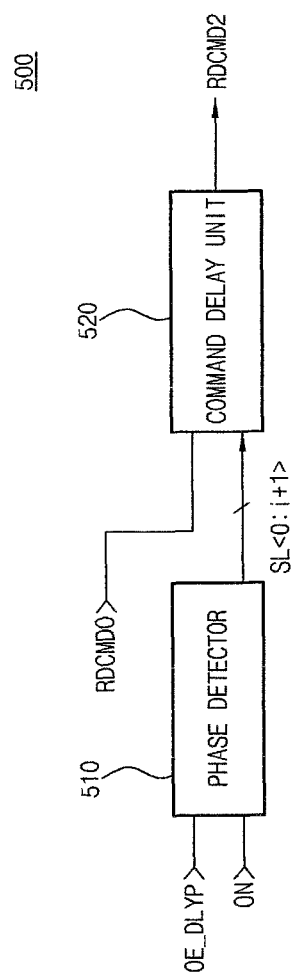
FIG. 7 is a block diagram showing an example of a delay unit 500 in FIG. 5.

As shown in FIG. 7, the delay unit 500 may include a phase detector 510 detecting a time point at which the delay pulse signal OE_DLYP is disabled by shifting the delay pulse signal OE_DLYP having a pulse by 'tOED' as a unit of a predetermined delay, and a command delay unit 520 delaying the internal read command signal RDCMD0 in accordance with an output signal SL<0:i+1> (here, i is a natural number of 1 or more) to be output as an internal read command signal RDCMD2 applied in a high frequency operation.

Figure 8:
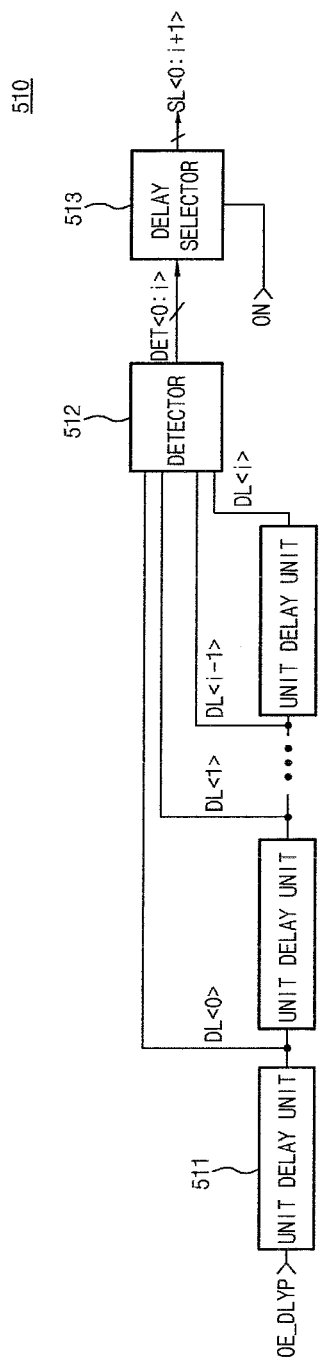
FIG. 8 is a block diagram showing an example of a phase detector 510 in FIG. 7.

Here, as shown in FIG. 8, the phase detector 510 may be include a plurality of delay units 511 each delaying the delay pulse signal OE_DLYP as a unit of a predetermined delay; a detector 512 outputting a plurality of detection signals DET<0:i> with which a disable time point of the delay pulse signal OE_DLYP can be detected through the delay pulse signal OE_DLYP and delay signals DL<0:i> output from the respective delay units 511; and a delay selector 513 outputting a plurality of delay selection signals SL<0:i> for determining a delay degree of an internal pulse signal through the plurality of detection signals DET<0:i>.

Figure 9:
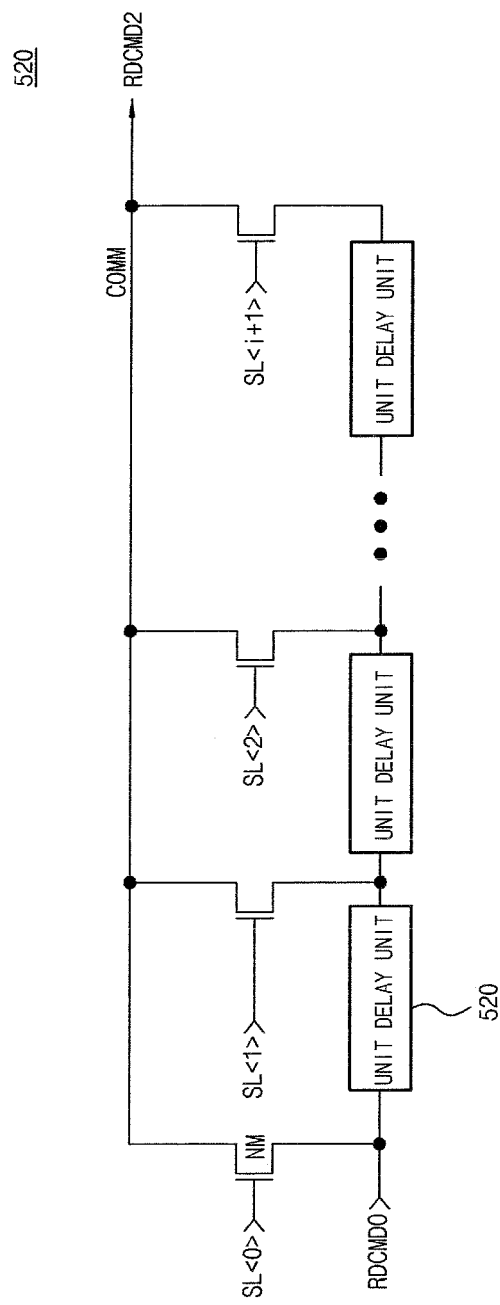
FIG. 9 is a block diagram showing an example of command delay unit 520 in FIG. 7.

Further, as shown in FIG. 9, the command delay unit 520 may include a plurality of unit delay units 521 each delaying the internal read command signal RDCMD0 as a unit of a predetermined delay, and a plurality of NMOS transistors NM transmitting the internal read command signal RDCMD0 and output signals of the respective unit delay unit 521 in accordance with the plurality of delay selection signals SL<0:i+1>. The command delay unit 520 outputs the internal read command signal RDCMD2 applied in a high frequency operation.

The selector 600 selects any one of the internal read command signals RDCMD1 and RDCMD2 to be output as a data output control signal OUTEN in accordance with the mode selection signal ON.

Figure 10:
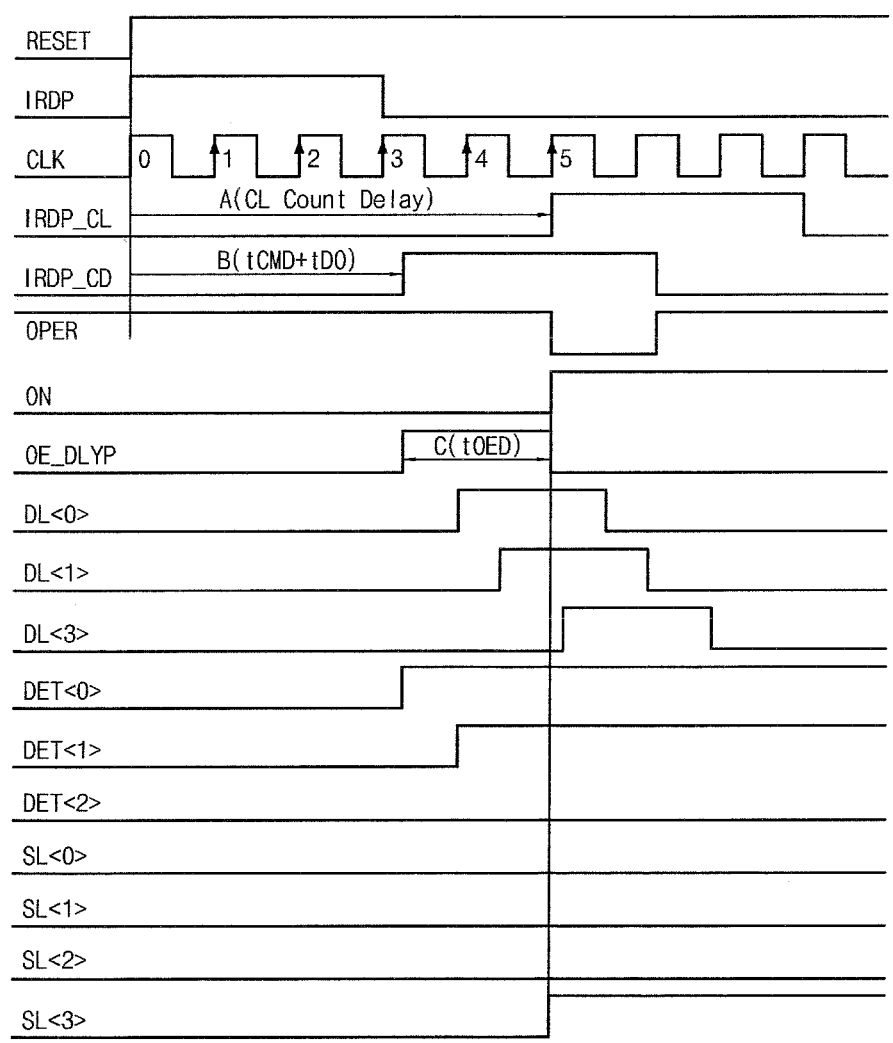
FIG. 10 is operational waveform diagram illustrating an operation of the operation mode controller 300 and the delay unit 500 in FIG. 5.

Hereinafter, an operation of this embodiment of the present invention in a high frequency operation, when a CAS latency is 5 (CL=5), will be described in detail with reference to FIG. 10.

First, if a reset signal RESET is enabled, the reference pulse generator 310 generates a reference pulse signal IRDP having a predetermined pulse width. Since the pulse width of the reference pulse signal IRDP becomes a reference with which any one of count shifting and delay modes is selected depending on a frequency, a designer can voluntarily adjust the pulse width.

The reference pulse signal IRDP is delayed by a CAS latency count delay time, i.e., 'A(CL Count Delay)', through the CAS latency delay unit 320 in accordance with a CAS latency signal CL so as to be output as a delay pulse signal IRDP_CL. At this time, since the CAS latency is 5, the CAS latency delay unit 320 provides a count delay 'CL−1,' i.e., 4 times.

Further, the reference pulse IRDP is delayed by a time in which 'tDO' denoting a time difference between an external clock signal CLK and a DLL clock signal DLLCLK is added to 'tCMD' being a internal read command generation delay time RDCMD0, i.e., 'B(tCMD+tDO),' to so as to be output as a delay pulse signal IRDP_CD.

The delay pulse signals IRDP_CL and IRDP_CD are input to the controller 340 such that there is generated a signal OPER having a low level at an interval in which the two signals IRDP_CL and IRDP_CD are enabled. Further, there is generated a mode selection signal ON enabled when the signal OPER is changed from a high level to a low level.

At this time, since 'A' is larger than 'B' in a low frequency operation, the signal OPER is not generated, so the mode selection signal ON is disabled. On the other hand, since 'B' is not changed and 'A' is reduced in a high frequency operation, the OPER is generated, so the mode selection signal ON is enabled.

Further, the delay pulse signals IRDP_CL and IRDP_CD are input to the controller 340 such that there is generated a delay pulse signal OE_DLYP which is enabled when the delay pulse signal IRDP_CD is enabled and disabled when the delay pulse signal IRDP_CL is enabled. Here, the delay pulse signal OE_DLYP has a pulse width of 'A(CL Count Delay)−B(tCMD+tDO),' i.e., 'C(toed).'

Meanwhile, if the mode selection signal ON is enabled, the count shifter 400 is inactivated, and the delay unit 500 is activated. Further, the selector 600 selects an output signal RDCMD2 of the delay unit 500.

That is, the delay pulse signal OE_DLYP passes through the plurality of unit delay units 511 to be output as a plurality of delay signals DL<0:i> each having a predetermined delay difference, and the plurality of delay signals DL<0:i> are compared to the delay pulse signal OE_DLYP through the detector 512 to be output as a plurality of detection signals DET<0:i> with which a disable time point of the delay pulse signal OE_DLYP can be detected.

At this time, the detector 512 performs an operation of comparing a delay signal DL<0> to the delay pulse signal OE_DLYP to generate a detection DET<0> and comparing a delay signal DL<1> to the delay pulse signal OE_DLYP to generate a detection DET<1>. This is an operation for measuring the pulse width of the delay pulse signal OE_DLYP, i.e., 'C(toed).'

The plurality of detection signals DET<0:i> generated in such a manner is output as a plurality of delay selection signals SL<0:i+1> with which a delay amount of the command delay unit 520 is determined at a time point at which the mode selection signal ON is enabled through the delay selector 513. Here, the enablement of the mode selection signal ON means that the comparison of the delay pulse signal OE_DLYP to the plurality of delay signals DL<0:i> is finished, and the operation of the detector 512 is completed.

Further, the plurality of delay selection signals SL<0:i+1> are input to the command delay unit 520 to turn on corresponding NMOS transistors NM, and delayed by a delay amount corresponding to the turned-on NMOS transistors NM in the plurality of unit delay units 521, i.e., 'C(toed),' to be output as the internal read command signal RDCMD2.

For example, if a detection signal DET<2> is disabled by comparing a delay signal DL<2> to the delay pulse signal OE_DLYP, a delay selection signal SL<3> corresponding to delay signal DL<2> is enabled, and the internal read command signal RDCMD0 passes three unit delay units 521 to be output as the internal read command signal RDCMD2.

At this time, the reason why the delay selection signal SL<0:i+1> is set to be changed depending on the detection signal DET<i> is for the purpose that, when there is no margin with which the delay signal DL<0> is compared to the delay pulse signal OE_DLYP due to the reduction of the pulse width of the delay pulse signal OE_DLYP in high frequencies, the internal read command signal RDCMD0 does not pass through the unit delay unit 521 but is output as the internal read command signal RDCMD2.

The internal read command signal RDCMD2 generated through such a process is output as a data output control signal OUTEN through the selector 600.

Figure 11:
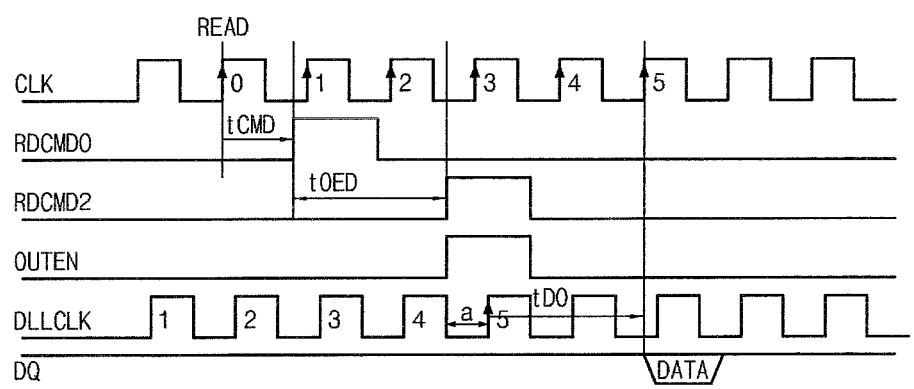
FIG. 11 is a waveform diagram illustrating a delay mode operation according to an embodiment of the present invention.

FIG. 11 illustrates an operational waveform diagram of this embodiment of the present invention described above when a CAS latency is 5 in a high frequency operation and a mode selection signal ON is enabled.

Since a mode selection signal ON is enabled in a high frequency operation, an internal read command signal RDCMD2 is output as a data output control signal OUTEN through the selector 600 as it is.

Figure 12:
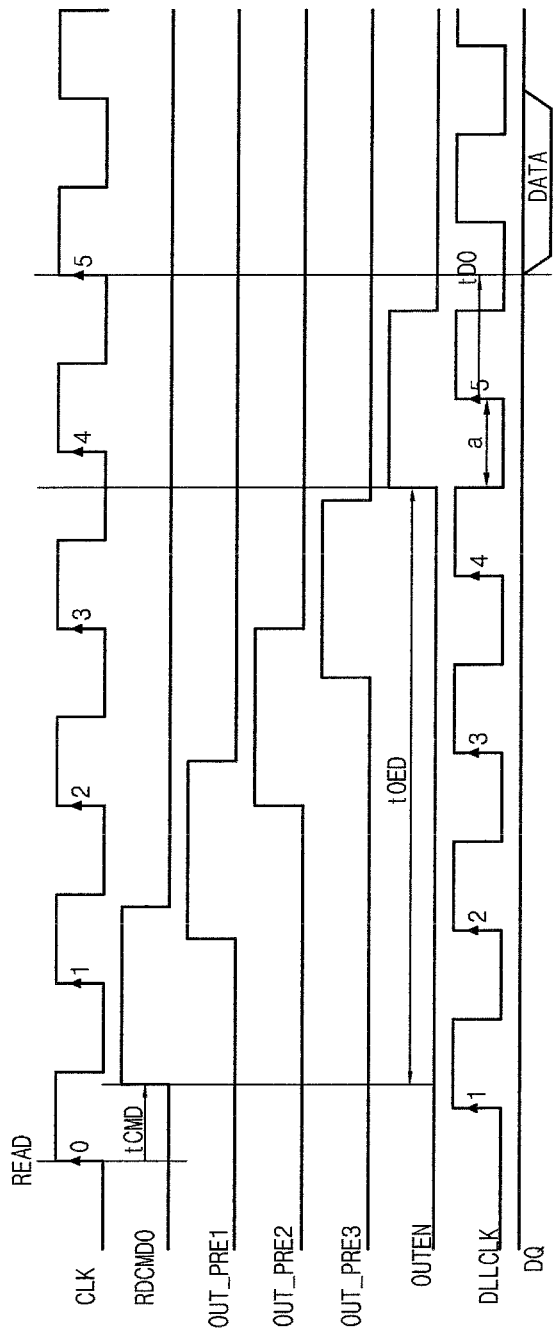
FIG. 12 is a waveform diagram illustrating a count shifting mode operation according to an embodiment of the present invention.

FIG. 12 illustrates an operational waveform diagram of this embodiment of the present invention described above in a count shifting mode when a CAS latency is 5 in a low frequency operation and a mode selection signal ON is disabled.

Since, a mode selection signal ON is disabled in a low frequency operation, an internal read command signal RDCMD1 output from the count shifter 400 is output as a data output control signal OUTEN through the selector 600 as it is.

Figure 13:
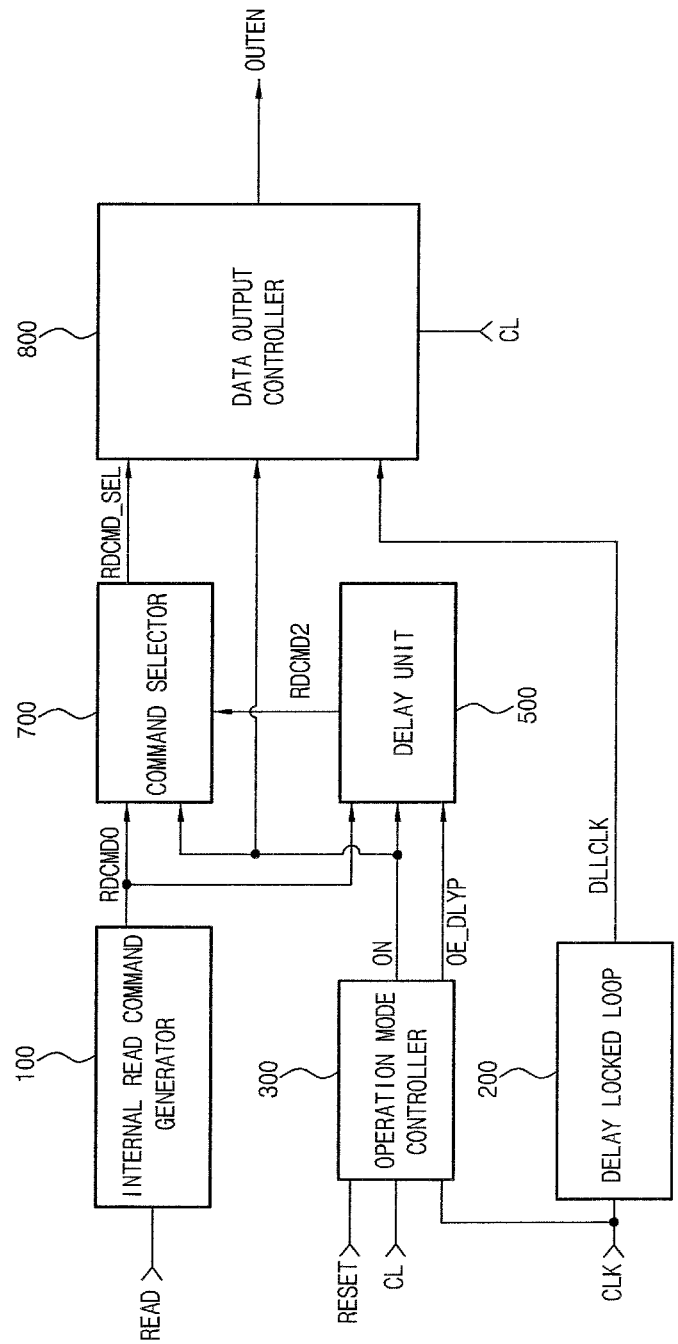
FIG. 13 is a block diagram showing another example of the data output control circuit in FIG. 4.

A configuration of FIG. 13 is disclosed as another embodiment of the present invention. This embodiment selects any one of an internal read command signal RDCMD0 generated from an internal read command generator 700 and an internal read command signal RDCMD2 output from the delay unit 500, and counts and shifts or bypasses the selected signal to be output as a data output control signal OUTEN.

Specifically, this embodiment of FIG. 13 includes an internal read command generator 100, a delay locked loop 200, an operation mode controller 300, a delay unit 500, a command selector 700 and a data output controller 800.

Here, since each of the internal read command generator 100, the delay locked loop 200, the operation mode controller 300, the delay unit 500 in FIG. 13 has the same configuration as FIG. 3, detailed descriptions will be omitted.

The command selector 700 selects any one of internal read command signals RDCMD0 and RDCMD2 in accordance with a mode selection signal ON to be output as an internal read command signal RDCMD_SEL.

Figure 14:
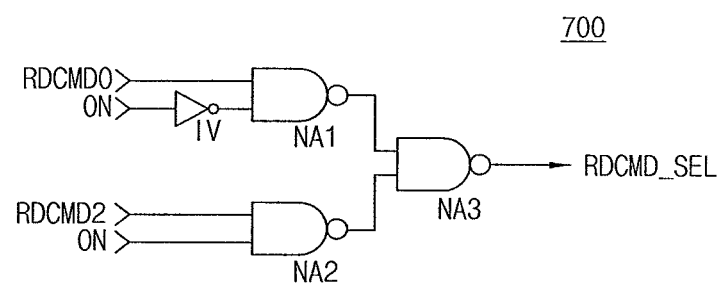
FIG. 14 is a circuit diagram showing an example of a command selector 700 in FIG. 13.

As shown in FIG. 14, the command selector 700 may include an inverter IV inverting a mode selection signal ON; a NAND gate NA1 NAND combining an internal read command signal RDCMD0 and an output signal of the inveter IV; a NAND gate NA2 NAND combining an internal read command signal RDCMD2 and a mode selection signal ON; and a NAND gate NA3 NAND combining outputs of the NAND gates NA1 and NA2 to be output as an internal read command signal RDCMD_SEL.

The data output controller 800 counts and shifts or bypasses the internal read command signal RDCMD_SEL in accordance with the mode selection signal ON to be output as a data output control signal OUTEN.

Figure 15:
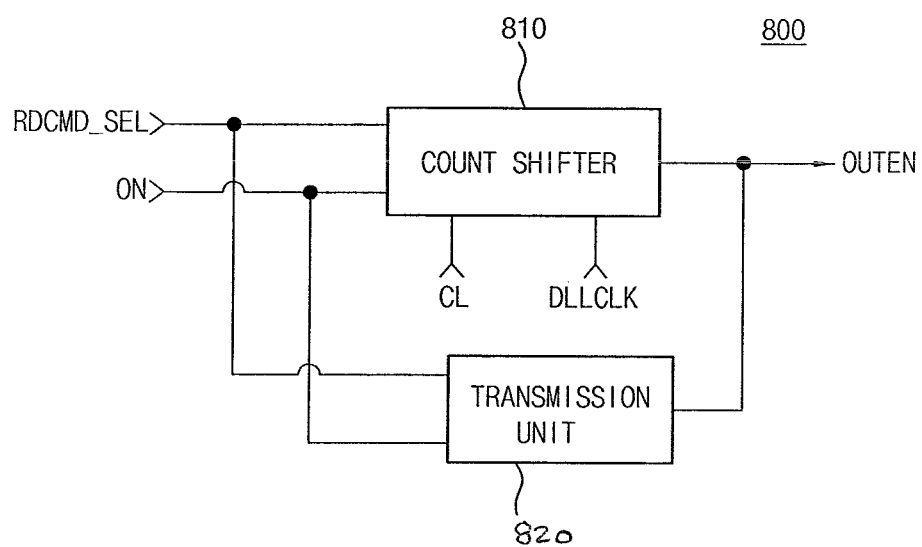
FIG. 15 is a block diagram showing an example of a data output controller 800 in FIG. 13.

As shown in FIG. 15, the data output controller 800 may include a count shifter 810 counting and shifting the internal read command signal RDCMD_SEL in accordance with a mode selection signal ON to be output as a data output control signal OUTEN, and a transmission unit 820 outputting the internal read command signal RDCMD_SEL as a data output control signal OUTEN as it is in accordance with the mode selection signal ON.

In the another embodiment of the present invention with such a configuration, if a mode selection signal ON is enabled in high frequencies, an internal read command signal RDCMD2 among internal read command signals RDCMD0 and RDCMD2 is selected through the command selector 700.

Further, the data output controller 800 outputs an internal read command signal RDCMD_SEL corresponding to the internal read command signal RDCMD2 as a data output control signal OUTEN as it is.

On the other hand, when the mode selection signal ON is disabled in low frequencies, the internal read command signal RDCMD0 among the internal read command signals RDCMD0 and RDCMD2 is selected through the command selector 700.

Further, the data output controller 800 counts and shifts the internal read command signal RDCMD_SEL corresponding to the internal read command signal RDCMD0 to be output as a data output control signal OUTEN.

Since such another embodiment of the present invention is identical with the operation of FIG. 3, this embodiment of the present invention can have the same advantage.

As described above, the present invention has an advantage in that a delay mode and a count shifting mode are selectively used depending on an operation frequency, so that an operation is possible over a broad frequency range, and failures due to a data output time point can be reduced in high frequencies.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A data output control circuit of a semiconductor memory device for controlling data output in a read operation, comprising:
a low frequency mode controller controlling a read command signal during a first operation mode to output the read command signal as a first command signal if the read command signal is determined to be a low frequency operation;
a high frequency mode controller controlling the read command signal during a second operation mode to output the read command signal as a second command signal if the read command signal is determined to be a high frequency operation; and
a selector selecting any one of the first and second command signals through CAS latency information to output one of the first and second command signals as a data output control signal
wherein the low frequency mode controller counts and shifts the read command signal in accordance with the CAS latency to be output as the first command signal.

2. The data output control circuit as set forth in claim 1, wherein the low frequency operation is determined by a first CAS latency control signal being a control signal for low frequencies, in which a CAS latency is bypassed, and the high frequency operation is determined by a second CAS latency control signal being a control signal for high frequencies, generated by the CAS latency and data output delay information.

3. The data output control circuit as set forth in claim 2, wherein the high frequency mode controller delays the read command signal by a time in which a time corresponding to the data output delay is subtracted from the CAS latency so as to be output as the second command signal.

4. The data output control circuit as set forth in claim 3, wherein the high frequency mode controller delays the read command signal by a time in which an internal read command signal generation delay time is added to a time difference between external and DLL clock signals so as to be output as the second command signal after a read instruction.

5. The data output control circuit as set forth in claim 1, wherein the selector outputs the first command signal as the data output control signal in a low frequency operation, and outputs the second command signal as the data output control signal in a high frequency operation.

6. A data output control circuit of a semiconductor memory device for controlling a data output time point using a CAS latency and a DLL clock in a read operation, comprising:
an operation mode controller providing a mode selection signal by which at least high and low frequencies can be discriminated in accordance with a frequency of the external clock signal through the CAS latency information and an external clock signal, and a pulse signal with a pulse width corresponding to a data output time point in high frequencies;

a count shifter counting and shifting an internal read command signal generated to perform the read operation by synchronizing it to the DLL clock in accordance with the state of the mode selection signal so as to be output as a first command signal;

a delay unit delaying the internal read command signal by the pulse width of the pulse signal in accordance with the state of the mode selection signal so as to be output as a second command signal; and a selector selecting any one of the first and second command signals in accordance with the state of the mode selection signal so as to be output as a data output control signal.

7. The data output control circuit as set forth in claim 6, wherein the operation mode controller compares first, second and third times so as to determine an operation mode depending on a frequency, the first time being a CAS latency count delay time, the second time being an internal read command signal generation delay time after a read instruction and the third time being a time difference between the external clock signal and the DLL clock signal.

8. The data output control circuit as set forth in claim 7, wherein the operation mode controller includes: a pulse generator generating a reference pulse signal with a pulse width that becomes a reference in discriminating high frequencies from low frequencies; a first delay unit delaying the reference pulse signal by the first time through the CAS latency information and the external clock signal to be output as a first delay pulse signal; a second delay unit delaying the reference pulse signal by a time in which the second and third times are added together to be output as a second delay pulse signal; and a controller outputting the mode selection signal for comparing the first and second delay pulse signals to select an operation mode depending on a frequency and the pulse signal having a pulse width of a fourth time in which the addition of the second and third times is subtracted from the first time.

9. The data output control circuit as set forth in claim 8, wherein the controller outputs the mode selection signal denoting that the external clock signal is a high frequency if the first delay pulse signal is enabled when the second delay pulse is in an enable state, and outputs the mode selection signal denoting that the external clock signal is a low frequency if the first delay pulse signal is disabled when the second delay pulse is in an enable state.

10. The data output control circuit as set forth in claim 8, wherein the controller outputs a pulse signal having a pulse width of the fourth time that is enabled when the second delay pulse signal is enabled, and disabled when the first delay pulse is enabled.

11. The data output control circuit as set forth in claim 6, wherein the delay unit is operated when the operation is determined to be a high frequency operation by the state of the mode selection signal.

12. The data output control circuit as set forth in claim 11, wherein the delay unit includes: a phase detector counting the pulse signal to detect the pulse width of the pulse signal when the operation is determined to be a high frequency operation by the state of the mode selection signal; and a command delay unit delaying the internal read command signal in accordance with an output signal of the phase detector to be output as the second command signal.

13. The data output control circuit as set forth in claim 12, wherein the phase detector includes: a plurality of first unit delay means connected in series to delay the pulse signal as a unit of a predetermined delay; a detection means comparing the pulse signal to an output of each of the first unit delay means to be output as a detection signal enabled at a time point in which the pulse signal is disabled; and a selection means operated by the mode selection signal to output a delay selection signal for determining a delay degree of the internal read command signal through the detection signal.

14. The data output control circuit as set forth in claim 12, wherein the command delay unit includes: a plurality of second unit delay means connected in series to delay the internal read command signal as a predetermined unit; and a plurality of switching means each connected between an input/output node of each of the second unit delay means and a common node to be controlled by an output signal of the phase detector, wherein the switching means corresponding to the output of the phase detector is turned on such that the second command signal is output to the common node.

15. The data output control circuit as set forth in claim 6, wherein the count shifter counts and shifts the internal read command signal through the CAS latency information and the DLL clock signal to be output as the first command signal when the operation is determined to be a low frequency operation by the state of the mode selection signal.

16. The data output control circuit as set forth in claim 15, wherein the count shifter is operated by the mode selection signal to count the internal read command signal by the CAS latency from which 1 is subtracted through the DLL clock signal.

17. A data output control circuit, comprising:
a read command generator generating a first internal read command signal through a read command signal generated in a read operation;
a delay locked loop negative-delaying an external clock signal to be output as a DLL clock signal for the purpose of synchronizing read data to the external clock signal;
an operation mode controller providing a mode selection signal with which at least high and low frequencies can be discriminated in accordance with the frequency of the external clock signal through a CAS latency information and an external clock signal, and a pulse signal with a pulse width corresponding to a data output time point in high frequencies;
a count shifter counting and shifting the first internal read command signal by synchronizing it to the DLL clock in accordance with the rotate of the mode selection signal so as to be output as a second command signal;
a delay unit delaying the first internal read command signal by the pulse width of the pulse signal in accordance with the state of the mode selection signal so as to be output as a third command signal; and
a selector selecting any one of the second and third command signals in accordance with the state of the mode selection signal so as to be output as a data output control signal.

18. The data output control circuit as set forth in claim 17, wherein the operation mode controller compares first, second and third times so as to determine an operation mode depending on a frequency, the first time being a CAS latency count delay time, the second time being a first internal read command signal generation delay time after a read instruction and the third time being a time difference between the external clock signal and the DLL clock signal.

19. The data output control circuit as set forth in claim 18, wherein the operation mode controller includes: a pulse generator generating a reference pulse signal with a pulse width that becomes a reference in discriminating high frequencies from low frequencies; a first delay unit delaying the reference pulse signal by the first time through the CAS latency information and the external clock signal to be output as a first delay pulse signal; a second delay unit delaying the reference pulse signal by a time in which the second and third times are added together to be output as a second delay pulse signal; and a controller outputting the mode selection signal for comparing the first and second delay pulse signals to select an operation mode depending on a frequency and the pulse signal having a pulse width of a fourth time in which the addition of the second and third times is subtracted from the first time.

20. The data output control circuit as set forth in claim 19, wherein the controller outputs the mode selection signal denoting that the external clock signal is a high frequency if the first delay pulse signal is enabled when the second delay pulse is in an enable state, and outputs the mode selection signal denoting that the external clock signal is a low frequency if the first delay pulse signal is disabled when the second delay pulse signal is in an enable state.

21. The data output control circuit as set forth in claim 19, wherein the controller outputs a pulse signal having a pulse width of the fourth time that is enabled when the second delay pulse signal is enabled, and disabled when the first delay pulse is enabled.

22. The data output control circuit as set forth in claim 17, wherein the delay unit is operated when the operation is determined to be a high frequency operation by the state of the mode selection signal.

23. The data output control circuit as set forth in claim 22, wherein the delay unit includes: a phase detector counting the pulse signal to detect the pulse width of the pulse signal when the operation is determined to be a high frequency operation by the state of the mode selection signal; and a command delay unit delaying the first internal read command signal in accordance with an output signal of the phase detector to be output as the third command signal.

24. The data output control circuit as set forth in claim 23, wherein the phase detector includes: a plurality of first unit delay means connected in series to delay the pulse signal as a unit of a predetermined delay; a detection means comparing the pulse signal to an output of each of the first unit delay means to be output as a detection signal enabled at a time point in which the pulse signal is disabled; and a selection means operated by the mode selection signal to output a delay selection signal for determining a delay degree of the first internal read command signal through the detection signal.

25. The data output control circuit as set forth in claim 23, wherein the command delay unit includes: a plurality of second unit delay means connected in series to delay the first internal read command signal as a predetermined unit; and a plurality of switching means each connected between an input/output node of each of the second unit delay means and a common node to be controlled by an output signal of the phase detector,
wherein the switching means corresponding to the output of the phase detector is turned on such that the third internal read command signal is output to the common node.

26. The data output control circuit as set forth in claim 17, wherein the count shifter counts and shifts the first internal read command signal through the CAS latency information and the DLL clock signal to be output as the second command signal when the operation is determined to be a low frequency operation by the state of the mode selection signal.

27. The data output control circuit as set forth in claim 26, wherein the count shifter is operated by the mode selection signal to count the first internal read command signal by the CAS latency from which 1 is subtracted through the DLL clock signal.

28. A data output control circuit, comprising:
a read command generator generating a first internal read command signal through a read command signal generated in a read operation;
a delay locked loop negative-delaying an external clock signal to be output as a DLL clock signal for the purpose of synchronizing read data to the external clock signal;
an operation mode controller providing a mode selection signal with which at least high and low frequencies can be discriminated in accordance with the frequency of the external clock signal through a CAS latency information and an external clock signal, and a pulse signal with a pulse width corresponding to a data output time point in high frequencies;
a delay unit counting the pulse signal to detect the pulse width of the pulse signal in accordance with the state of the mode selection signal, and then delaying the first internal read command signal by the pulse width of the pulse signal to be output as a second internal read command signal;
a command selector selecting any one of the first and second internal read command signals in accordance with the state of the mode selection signal so as to be output as a third internal read command signal; and
a data output controller counting and shifting the third internal read command signal by synchronizing it to the DLL clock in accordance with the state of the mode selection signal, or outputting the third internal read command signal as a data output control signal.

29. The data output control circuit as set forth in claim 28, wherein the operation mode controller compares first, second and third times so as to determine an operation mode depending on a frequency, the first time being a CAS latency count delay time, the second time being an internal read command signal generation delay time after a read instruction and the third time being a time difference between the external clock signal and the DLL clock signal.

30. The data output control circuit as set forth in claim 29, wherein the operation mode controller includes: a pulse generator generating a reference pulse signal with a pulse width that becomes a reference in discriminating high frequencies from low frequencies; a first delay unit delaying the reference pulse signal by the first time to be output as a first delay pulse signal; a second delay unit delaying the reference pulse signal by a time in which the second and third times are added together to be output as a second delay pulse signal; and a controller outputting the mode selection signal for comparing the first and second delay pulse signals to select an operation mode depending on a frequency and the pulse signal having a pulse width of a fourth time in which the addition of the second and third times is subtracted from the first time.

31. The data output control circuit as set forth in claim 30, wherein the controller outputs the mode selection signal denoting that the external clock signal is a high frequency if the first delay pulse signal is enabled when the second delay pulse is in an enable state, and outputs the mode selection signal denoting that the external clock signal is a low frequency if the first delay pulse signal is disabled when the second delay pulse signal is in an enable state.

32. The data output control circuit as set forth in claim 30, wherein the controller outputs a pulse signal having a pulse width of the fourth time that is enabled when the second delay pulse signal is enabled, and disabled when the first delay pulse is enabled.

33. The data output control circuit as set forth in claim 28, wherein the delay unit is operated when the operation is determined to be a high frequency operation by the state of the mode selection signal.

34. The data output control circuit as set forth in claim 33, wherein the delay unit includes: a phase detector counting the pulse signal to detect the pulse width of the pulse signal when the operation is determined to be a high frequency operation by the state of the mode selection signal; and a command delay unit delaying the first internal read command signal in accordance with an output signal of the phase detector to be output as the second internal read command signal.

35. The data output control circuit as set forth in claim 34, wherein the phase detector includes: a plurality of first unit delay means connected in series to delay the pulse signal as a unit of a predetermined delay; a detection means comparing the pulse signal to an output of each of the first unit delay means to be output as a detection signal enabled at a time point in which the pulse signal is disabled; and a selection means operated by the mode selection signal to output a delay selection signal for determining a delay degree of the first internal read command signal through the detection signal.

36. The data output control circuit as set forth in claim 34, wherein the command delay unit includes: a plurality of second unit delay means connected in series to delay the first internal read command signal as a predetermined unit; and a plurality of switching means each connected between an input/output node of each of the second unit delay means and a common node to be controlled by an output signal of the phase detector,
wherein the switching means corresponding to the output of the phase detector is turned on such that the second internal read command signal is output to the common node.

37. The data output control circuit as set forth in claim 28, wherein the command selector includes: an inverter inverting the mode selection signal; a first NAND gate NAND combining the first internal read command signal and an output signal of the inverter; a second NAND gate NAND combining the second internal read command signal and the mode selection signal; and a third NAND gate NAND combining outputs of the first and second NAND gates to be output as the third internal read command signal.

38. The data output control circuit as set forth in claim 28, wherein the data output controller includes: a count shifter counting and shifting the third internal read command signal through the CAS latency information and the DLL clock signal to be output as the data output control signal when the operation is determined to be a low frequency operation by the state of the mode selection signal; and a transmission unit outputting the third internal read command signal as the data output control signal as it is when the operation is determined to be a high frequency operation by the state of the mode selection signal.

39. The data output control circuit as set forth in claim 38, wherein the count shifter is operated by the mode selection signal to count the internal read command signal by the CAS latency from which 1 is subtracted through the DLL clock signal.

40. A data output control method, comprising:
a first step of comparing first, second and third times to select a delay mode if it is determined to be a high frequency operation and to select a count shifting mode if it is determined to be a low frequency operation, the first time being a CAS latency count delay time, the second time being an internal read command signal generation delay time after a read instruction and the third time being a time difference between an external clock signal and a DLL clock signal;
a second step of detecting a fourth time in which the addition of the second and third times is subtracted from the first time and then delaying the internal read command signal by the fourth time to be output as a data output control signal for controlling a data output time point in a delay mode; and
a third step of counting the internal read command signal through the DLL clock signal to be output as the data output control signal shifted by the fourth time in a count shifting mode.

41. The data output control method as set forth in claim 40, wherein the first step includes the sub-steps of: generating a reference pulse signal with a pulse width that becomes a reference in discriminating high frequencies from low frequencies; delaying the reference pulse signal by the first time to be output as a first delay pulse signal; delaying the reference pulse signal by a time in which the second and third times are added together to be output as a second delay pulse signal; and comparing the first and second delay pulse signals to select the delay mode if the first delay pulse signal is enabled when the second delay pulse signal is in an enable state and to select the count shifting mode if the first delay pulse signal is disabled when the second delay pulse signal is in an enable state.

42. The data output control method as set forth in claim 40, wherein the second step includes the sub-steps of: counting a signal having a pulse width of the fourth time; and delaying the internal read command signal by the fourth time to be output as the data output control signal.

43. A data output control method, comprising:
a first step of generating a first internal read command signal through a read command signal generated in a read operation;
a second step of negative-delaying an external clock signal to be output as a DLL clock signal for the purpose of synchronizing read data to the external clock signal;
a third step of comparing first, second and third times to select a delay mode if it is determined to be a high frequency operation and to select a count shifting mode if it is determined to be a low frequency operation, the first time being a CAS latency count delay time, the second time being an internal read command signal generation delay time after a read instruction and the third time being a time difference between the external clock signal and the DLL clock signal;
a fourth step of outputting a pulse signal having a pulse width of a fourth time in which the addition of the second and third times is subtracted from the first time in the delay mode;
a fifth step of counting the first delay pulse signal to detect the fourth time in the delay mode and then delaying the first internal read command signal by the fourth time to be output as a second internal read command signal;
a sixth step of selecting the first internal read command signal in the count shifting mode, and selecting the second internal read command signal in the delay mode; and
a seventh step of counting the first internal read command signal through the DLL clock signal to be output as a data output control signal for controlling a data output time point shifted by the fourth time in a count shifting mode, and outputting the second internal read command signal as the data output control signal as it is in the delay mode.

44. The data output control method as set forth in claim 43, wherein the first step includes the sub-steps of: generating a reference pulse signal with a pulse width that becomes a reference in discriminating high frequencies from low frequencies; delaying the reference pulse signal by the first time to be output as a first delay pulse signal; delaying the reference pulse signal by a time in which the second and third times are added together to be output as a second delay pulse signal; and comparing the first and second delay pulse signals to select the delay mode if the first delay pulse signal is enabled when the second delay pulse signal is in an enable state and to select the count shifting mode if the first delay pulse signal is disabled when the second delay pulse signal is in an enable state.

45. The data output control method as set forth in claim 43, wherein the second step includes the sub-steps of: counting a signal having a pulse width of the fourth time; and delaying the internal read command signal by the fourth time to be output as the data output control signal.

* * * * *